United States Patent [19]

Rijns

[11] Patent Number: 5,668,502
[45] Date of Patent: Sep. 16, 1997

[54] AMPLIFIER STAGE HAVING A SWITCHABLE GAIN AND REDUCED DISTORTION

[75] Inventor: Johannes J. F. Rijns, Nijmegen, Netherlands

[73] Assignee: U.S. Philips Corporation, New York, N.Y.

[21] Appl. No.: 625,959

[22] Filed: Apr. 1, 1996

[30] Foreign Application Priority Data

Apr. 4, 1995 [EP] European Pat. Off. ............. 95200848

[51] Int. Cl.$^6$ .................. H03F 3/45; H03G 3/30
[52] U.S. Cl. .................................. 330/254; 330/283
[58] Field of Search ................... 330/51, 87, 254, 330/278, 279, 283

[56] References Cited

U.S. PATENT DOCUMENTS 5,510,738  4/1996  Gorecki et al. .............. 330/252 X

FOREIGN PATENT DOCUMENTS

| 0587965A1 | 3/1994 | European Pat. Off. | ......... H03F 1/02 |
| 154911 | 9/1983 | Japan | ............... 330/254 |
| 9416494A1 | 7/1994 | WIPO | ............... H03F 3/45 |

Primary Examiner—James B. Mullins
Attorney, Agent, or Firm—Edward W. Goodman

[57] ABSTRACT

An amplifier stage including a differential pair (T1, T2) is provided with a resistive ladder (R1 ... R2n) coupled between the second control electrodes of said differential pair. Taps on mirror positions along the resistive ladder (R1 ... R2n) are switchably connected to first and second current source transistors (T3, T4), the current source transistors having their control electrodes connected to the first main electrodes of the transistors forming the differential pair. By placing the switches in series with the current source transistors (T3, T4), the influence of the non-linear impedance of the switches is reduced to negligibly small proportions as the output impedance of the current source transistors (T3, T4) is considerably higher than the impedance of the switches. Thus, a linear conversion impedance is obtained.

2 Claims, 1 Drawing Sheet

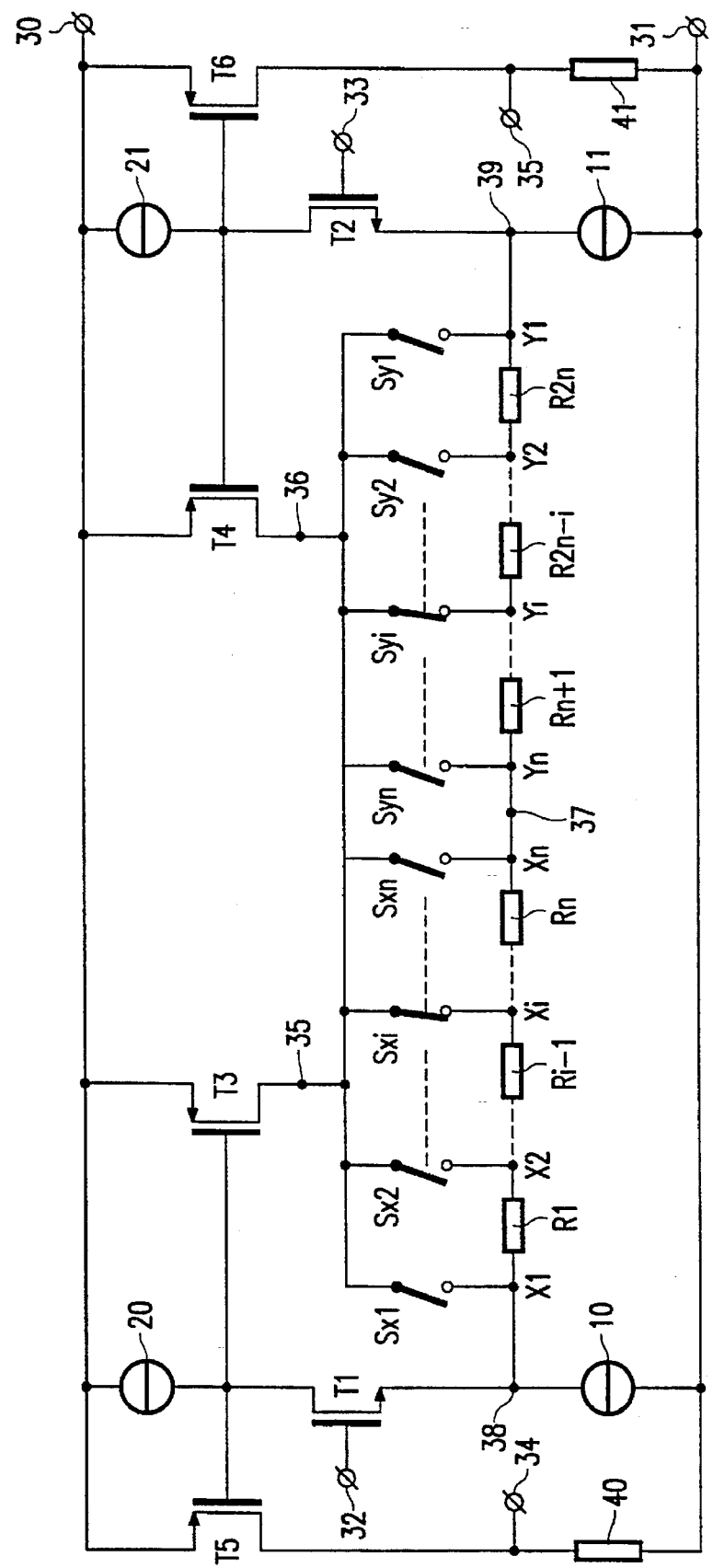

AMPLIFIER STAGE HAVING A SWITCHABLE GAIN AND REDUCED DISTORTION

BACKGROUND OF THE INVENTION

1. Field of the Invention

The invention relates to an amplifier stage comprising first and second transistors, each having a control electrode and a first and a second main electrode, the second main electrodes of said transistors being coupled to each other via a resistive ladder having a plurality of taps a gain of said amplifier stage being switchable by selecting parts of said ladder.

2. Description of the Related Art

Such an amplifier stage is known from the European patent application EP 0 587 965 A1. A conversion of the input voltage applied across the control electrodes of the transistors is converted into a current by this resistive ladder. By bridging selected parts of said resistive ladder, a conversion impedance of the resistive ladder can be changed, thus effectively changing the gain of the amplifier stage. A disadvantage of the known amplifier stage is that the impedance of the switches, used for bridging selected parts of the ladder, becomes part of the conversion impedance seen between the second main electrodes of the transistors. As the switches are often realized as transistors, which have a non-linear impedance in a closed state, the resulting impedance between the second main electrodes will become non-linear. This will result in distortion, especially when the impedance of the closed switches is of (or close to) the order of magnitude of the resulting impedance of the ladder.

SUMMARY OF THE INVENTION

An object of the invention is to provide an amplifier stage having a switchable gain and having reduced distortion.

An amplifier stage according to the invention is characterized in that said amplifier stage comprises first and second current source transistors, each having a control electrode and a first and a second main electrode, said first and second current source transistors having their control electrodes coupled to the first main electrodes of the first and second transistors, respectively, and further comprises a plurality of switches for coupling the first main electrodes of the first and second current source transistors to respective taps of the resistive ladder. The current source transistors provide a feedback loop, through which the voltage-to-current conversion is linearized. According to the invention, the switches are placed in series with the current source transistors. As the impedance of the current source transistor is significantly larger than the impedance of a closed switch, the impedance of the switch can be neglected. Thus the influence of the non-linear impedance of the switches on the conversion impedance is negligibly small, thereby realizing a linear conversion impedance, even when the impedance of the switch is of the same order of magnitude of the impedance of the resistive elements, which build up the resistive ladder.

It is to be noted that the feedback provided by the current source transistors is known from WO 94/16494 in a configuration of an amplifier stage for obtaining low distortion, where the first main electrodes of the current source transistors are directly connected to the second main electrodes of the first and second transistors, respectively. In this configuration, however, a gain of the amplifier stage is not made switchable.

An embodiment of the amplifier stage according to the invention is characterized in that the amplifier stage comprises first and second current sources, being coupled to the first main electrodes of the fast and second transistors, respectively. Through this measure, the currents through the first and second transistors will be kept constant, resulting in a voltage at the second main electrode of each of the transistors, which will accurately follow a voltage applied to the control electrode of the transistors. This will further linearize the voltage-to-current conversion, which leads to a further reduction of the distortion.

BRIEF DESCRIPTION OF THE DRAWING

The above object and features of the present invention will be more apparent from the following description of the preferred embodiments with reference to the drawings, wherein the sole figure is a circuit diagram of an embodiment of an amplifier arrangement according to the invention using MOS transistors.

DESCRIPTION OF THE PREFERRED EMBODIMENT

The invention is illustrated using MOS transistors, in which the control electrode is the gate, the first main electrode is the drain and the second main electrode is the source. It is also possible to use bipolar transistors, in which the control electrode is the base, the first main electrode is the collector, and the second main electrode is the emitter. In this case, the n-channel MOS transistors should be replaced by NPN transistors and the p-channel MOS transistors should be replaced by PNP transistors. Furthermore, it is possible to use transistors of the opposite conductivity type, for example, by using p-channel instead of n-channel transistors and vice versa.

The figure is a circuit diagram of an embodiment of an amplifier arrangement according to the invention using MOS transistors. N-channel transistors T1 and T2 form a differential pair, having their sources coupled via a resistive ladder 50, said resistive ladder, comprising resistive elements $R1 \ldots R2n$, further comprising a plurality of pairs of taps $(X_1, Y_1), \ldots, (X_n \ldots Y_n)$, a pair of taps $(X_i, Y_i)$, being located along the resistive ladder between the resistive elements, wherein $i=1 \ldots n$. A first part of said plurality of taps $X_1 \ldots X_2$ is connected to node 35 via respective switches $S_{X1} \ldots S_{Xn}$. A second part of said plurality of taps $Y_1 \ldots Y_n$ is connected to node 36 via respective switches $S_{Y1} \ldots S_{Yn}$. The gate of transistor T1 is connected to node 32 and the gate of transistor T2 is connected to node 33. A first (10) and a second (11) current source are coupled between the sources of transistors T1 and T2, respectively, and a first supply node 31. Third (21) and fourth (22) current sources are coupled between a second supply node 30 and the drains of transistors T1 and T2, respectively. First and second p-channel current source transistors T3 and T4 are provided, having their gates coupled to the drains of transistors T1 and T2, respectively, having their sources coupled to supply node 30, and having their drains coupled to nodes 35 and 36, respectively. P-channel output transistors T5 and T6 are provided, having their gates coupled to the drains of transistors T1 and T2, respectively, having their sources coupled to supply node 30, and having their drains connected to output nodes 34 and 35, respectively. First and second resistors 40 and 41 are provided between supply node 31 and output nodes 34 and 35, respectively. The switches $S_{X1} \ldots S_{Xn}, S_{Y1} \ldots S_{Yn}$ are implemented as semiconductor switches, for example, MOS transistors. In a closed state, these switches exhibit a non-linear behavior in the relation of the current through and the voltage across said switch. Thus these switches have a non-linear impedance. In normal operation, only one pair of switches $S_{Xi}$, $S_{Yi}$ is closed. All other switches are open. However, it is also possible to have more than one pair of switches closed at the same time, if so desired.

The operation of the amplifier stage is as follows. A differential voltage is applied to nodes 32 and 33 as an input voltage of the amplifier stage. Due to the constant current through transistors T1 and T2, this current being provided by current sources 20 and 21, respectively, the gate voltages of transistors T1 and T2 will be copied to nodes 38 and 39. Suppose now, by way of example, that switches $S_{Xi}$ and $S_{Yi}$ are closed and all other switches are open, as shown in FIG. 1. A constant current will flow from node 38 to tap Xi, equal to the difference in currents supplied by current sources 20 and 10. Thus, the voltage at tap Xi will directly follow the voltage on node 38, with a constant difference of the voltage drop across the impedance between node 38 and tap Xi, and thereby it will follow the gate voltage of transistor T1 as well, as the current through transistor T1 is constant. The same goes for tap Yi, which directly follows the voltage on node 39 and thereby the gate voltage of transistor T2. Thus, only the part of the resistive ladder between taps Xi and Yi provides a voltage-to-current conversion. Tap Xi delimits a part of the resistive ladder from R1 to R(i–1), and tap Yi delimits another part of the resistive ladder from R2n to R(2n–i). These parts are effectively "bridged" by the closure of switches $S_{Xi}$ and $S_{Yi}$, respectively, and thus no longer take part in the conversion impedance. The differential current resulting from this voltage-to-current conversion is supplied by current source transistors T3 and T4. The switches $S_{Xi}$ and $S_{Yi}$ are placed in series with current source transistors T3 and T4, respectively. As the output impedances of the transistors T3 and T4 as seen at nodes 35 and 36, respectively, are significantly larger than the non-linear impedances of the closed switches $S_{Xi}$ and $S_{Yi}$, the impedances of these switches can be neglected in comparison with the impedances of the current source transistors. Thus the non-linear impedance of the switches will not contribute to the voltage-to-current conversion in the impedance as seen between taps Xi and Yi. This greatly enhances the linearity of the voltage-to-current conversion in the amplifier stage, especially at low values of the resistive elements, which build up the resistive ladder. A differential output signal can be obtained at output nodes 34 and 35. Said differential output signal is generated by copying the currents through transistors T3 and T4 in transistors T5 and T6, respectively, the currents through transistors T5 and T6 being convened into voltages across resistors 40 and 41, respectively, which are connected to nodes 34 and 35, respectively. Thus a differential output voltage is available at output nodes 34 and 35. The gain of the amplifier stage can be set by closing a selected pair of switches $S_{Xi}$, $S_{Yi}$ of the plurality of switches $S_{X1} \ldots S_{Xn}$, $S_{Y1} \ldots S_{Yn}$. Thus, an amplifier stage is realized having a switchable gain and reduced distortion.

The invention is not limited to the embodiments as shown previously. The current sources 10 and 11 can be deleted and a further current source can be inserted, coupled between node 37 and supply node 31. Alternatively, this further current source can also just be added to the circuit of FIG. 1. Between taps Xn and Yn, one or more resistors can be added, if desired.

Furthermore, there are numerous possibilities for providing a pair of output signals. The current sources 20 and 21 can be replaced by respective resistors and now the output signals are available at the nodes connecting the resistors with transistors T1 and T2. Furthermore, the second main electrodes of transistors T3 and T4 do not have to be connected directly to the supply node 30. For example, the second main electrodes can be coupled to each other, and via a further current source to supply node 30. Or, when the current sources 20 and 21 are replaced by resistors, these resistors may each be provided with a tap, effectively dividing the resistors into two parts, the second main electrodes of transistors T3 and T4 being connected to the taps of the respective resistors. Now the output signals are available at the taps of the resistors. However, these examples are merely intended to illustrate that many configurations are possible without deviating from the gist of the invention. The provision of a switch for controlling the gain of the differential pair in series with a current source is demonstrated, said switch being connected to a tap of a resistive ladder, which determines a voltage-to-current conversion impedance, and wherein the current source is part of a feedback loop for linearizing the gain of the differential pair. By placing the switch in series with a current source, the influence of the non-linear impedance of the switch on the conversion impedance of the differential pair is substantially eliminated.

I claim:

1. An amplifier stage comprising first and second transistors, each having a control electrode and a first and a second main electrode, the second main electrodes of said transistors being coupled to each other via a resistive ladder having a plurality of taps, a gain of said amplifier stage being switchable by selecting parts of said ladder, characterized in that said amplifier stage comprises first and second current source transistors, each having a control electrode and a first and a second main electrode, said first and second current source transistors having their control electrodes coupled to the first main electrodes of the first and second transistors, respectively, and further comprises a plurality of switches for coupling the first main electrodes of the first and second current source transistors to respective taps of the resistive ladder.

2. The amplifier stage of claim 1, characterized in that the amplifier stage comprises first and second current sources, being coupled to the first main electrodes of the first and second transistors, respectively.

* * * * *